(12) United States Patent
Yu

(10) Patent No.: US 8,276,053 B2
(45) Date of Patent: Sep. 25, 2012

(54) DECODING CIRCUIT OPERATING IN RESPONSE TO DECODED RESULT AND/OR A PLURALITY OF VITERBI TARGET LEVELS WITH PATTERN DEPENDENCY

(75) Inventor: Chih-Ching Yu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 468 days.

(21) Appl. No.: 12/614,431

(22) Filed: Nov. 8, 2009

(65) Prior Publication Data

US 2011/0110468 A1    May 12, 2011

(51) Int. Cl.
*H03M 13/03* (2006.01)

(52) U.S. Cl. .......................... 714/795; 714/790

(58) Field of Classification Search .................. 714/790, 714/795
See application file for complete search history.

(56) References Cited

U.S. PATENT DOCUMENTS

| | | | |
|---|---|---|---|
| 7,131,054 B2* | 10/2006 | Greenberg et al. | 714/795 |
| 7,599,450 B2* | 10/2009 | Yang et al. | 375/340 |
| 7,949,927 B2* | 5/2011 | Park et al. | 714/762 |
| 8,142,981 B2* | 3/2012 | Ando et al. | 430/270.19 |
| 2005/0169412 A1 | 8/2005 | Yang et al. | |
| 2006/0233093 A1* | 10/2006 | Ando et al. | 369/288 |
| 2007/0098949 A1* | 5/2007 | Ando et al. | 428/64.4 |
| 2008/0115041 A1* | 5/2008 | Park et al. | 714/785 |
| 2010/0211858 A1* | 8/2010 | Saha et al. | 714/792 |
| 2010/0290327 A1* | 11/2010 | Ando et al. | 369/47.15 |

* cited by examiner

*Primary Examiner* — Charles Ehne
(74) *Attorney, Agent, or Firm* — Winston Hsu; Scott Margo

(57) ABSTRACT

A decoding circuit includes: a level adjuster with pattern dependency arranged to generate a plurality of Viterbi target levels with pattern dependency; and a Viterbi decoder arranged to perform Viterbi decoding according to the Viterbi target levels with pattern dependency. A decoding circuit includes a Viterbi decoder arranged to perform Viterbi decoding, and the Viterbi decoder includes a branch metric generator arranged to generate a plurality of branch metrics with pattern dependency according to an input of the Viterbi decoder and a plurality of Viterbi target levels with pattern dependency. In particular, the branch metric generator includes: a plurality of branch metric generation paths arranged to generate a plurality of intermediate values according to the input of the Viterbi decoder and the Viterbi target levels with pattern dependency, respectively; and a selection unit for selecting a portion of the intermediate values as the branch metrics with pattern dependency.

23 Claims, 9 Drawing Sheets

DECODING CIRCUIT OPERATING IN RESPONSE TO DECODED RESULT AND/OR A PLURALITY OF VITERBI TARGET LEVELS WITH PATTERN DEPENDENCY

BACKGROUND

The present invention relates to Viterbi decoding control, and more particularly, to a decoding circuit operating in response to decoded result and/or a plurality of Viterbi target levels with pattern dependency.

In an optical disc drive such as a Blu-ray Disc (BD) drive, Viterbi decoding is typically essential for decoding data. For example, a read path of the BD drive may comprise an optical pickup (OPU) module, a signal processing unit, an analog-to-digital converter (ADC), a finite impulse response equalizer (FIR EQ), a Viterbi decoder, and a data decoder. According to the related art, the Viterbi decoder does not always work properly, causing some problems such as data decoding fail. More specifically, in a situation where the disc accessed by the optical disc drive is not properly recorded, data decoding fail may occur due to improper Viterbi decoding control. In addition, in a situation where there are dusts or scratches on a disc accessed by the optical disc drive, similar problems may occur. A novel decoding circuit is therefore required to provide better Viterbi decoding control.

SUMMARY

It is therefore an objective of the claimed invention to provide a decoding circuit, and more particularly, a decoding circuit operating in response to decoded result and/or a plurality of Viterbi target levels with pattern dependency, in order to solve the above-mentioned problems.

An exemplary embodiment of a decoding circuit comprises: a level adjuster with pattern dependency arranged to generate a plurality of Viterbi target levels with pattern dependency; and a Viterbi decoder arranged to perform Viterbi decoding according to the Viterbi target levels with pattern dependency.

An exemplary embodiment of a decoding circuit comprises a Viterbi decoder arranged to perform Viterbi decoding according to a plurality of Viterbi target levels with pattern dependency. In addition, the Viterbi decoder comprises a branch metric generator arranged to generate a plurality of branch metrics with pattern dependency according to an input of the Viterbi decoder and the Viterbi target levels with pattern dependency. Additionally, the branch metric generator comprises: a plurality of branch metric generation paths arranged to generate a plurality of intermediate values according to the input of the Viterbi decoder and the Viterbi target levels with pattern dependency, respectively; and a selection unit arranged to select a portion of the intermediate values as the branch metrics with pattern dependency.

An exemplary embodiment of a decoding circuit comprises a Viterbi decoder arranged to perform Viterbi decoding according to a Viterbi target level. In addition, the Viterbi decoder comprises a branch metric generator arranged to generate at least a portion of a plurality of branch metrics with pattern dependency according to an input of the Viterbi decoder and the Viterbi target level. Additionally, the branch metric generator comprises: a branch metric generation path arranged to generate an intermediate value according to the input of the Viterbi decoder and the Viterbi target level; and a selection unit arranged to select the intermediate value or a constant value as at least the portion of the branch metrics with pattern dependency according to a control signal with pattern dependency.

An exemplary embodiment of a decoding circuit comprises a Viterbi decoder arranged to perform Viterbi decoding according to a control signal. In addition, the Viterbi decoder comprises: a branch metric generator arranged to generate a plurality of branch metrics according to an input of the Viterbi decoder and the control signal; an add-compare-select (ACS) unit arranged to perform ACS operations according to the branch metrics to generate a plurality of decision bits; and a survivor path memory arranged to temporarily store the decision bits and output an output of the Viterbi decoder.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
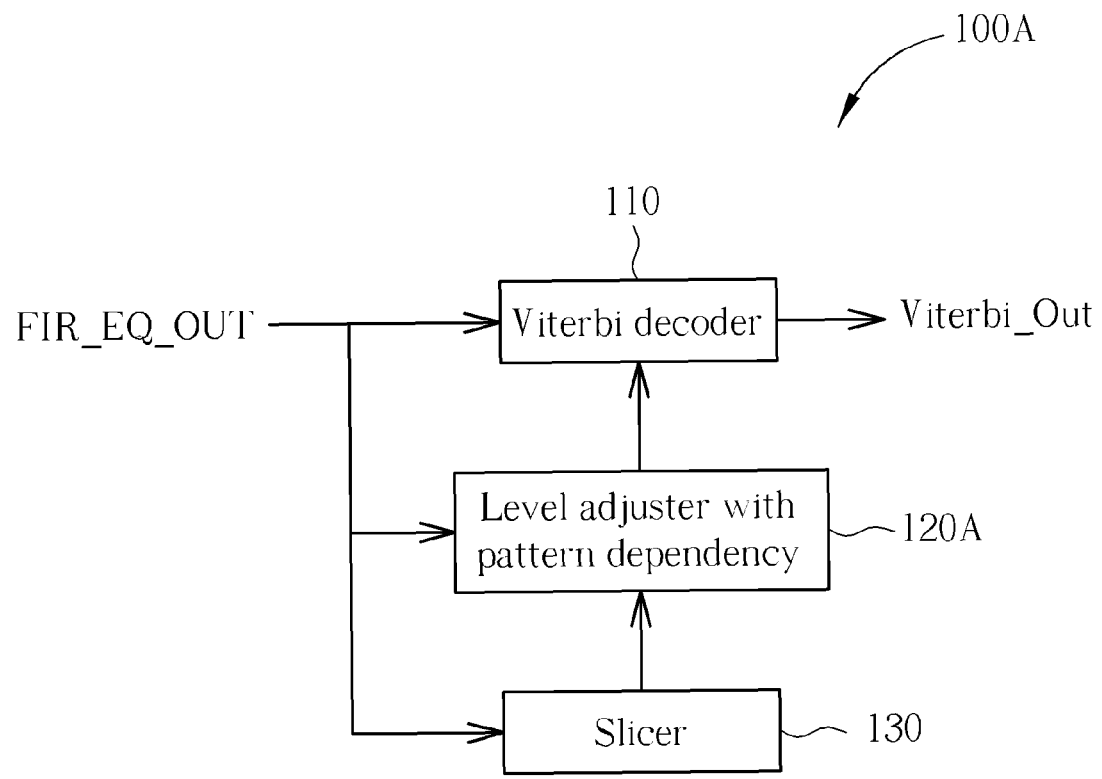
FIG. 1A is a diagram of a decoding circuit according to a first embodiment of the present invention.
Figure 1B:
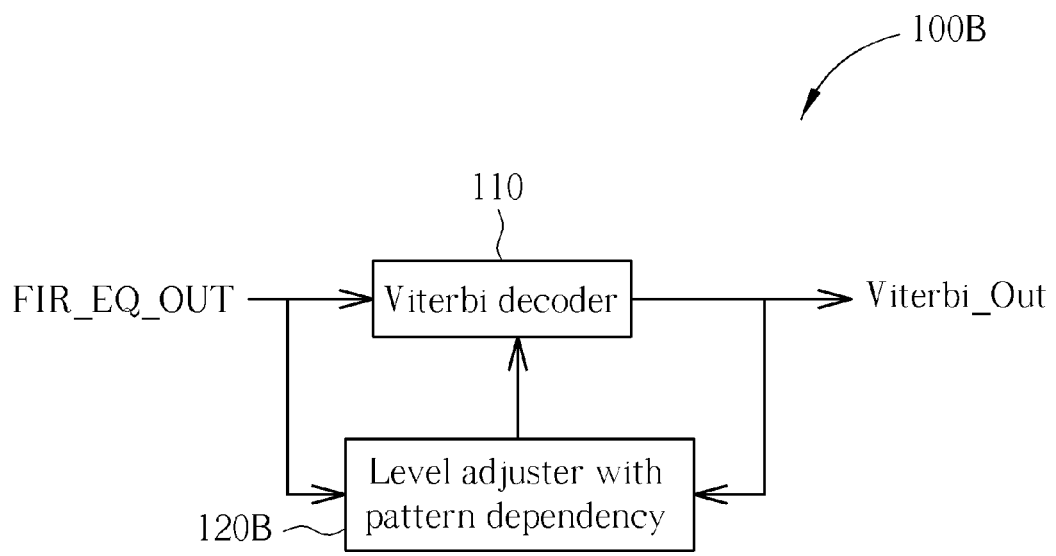
FIG. 1B is a diagram of a decoding circuit according to a second embodiment of the present invention.

Please refer to FIG. 1A and FIG. 1B. FIG. 1A is a diagram of a decoding circuit 100A according to a first embodiment of the present invention, and FIG. 1B is a diagram of a decoding circuit 100B according to a second embodiment of the present invention. The decoding circuit 100A comprises a Viterbi decoder 110, a level adjuster with pattern dependency 120A, and a slicer 130, while the decoding circuit 100B comprises the Viterbi decoder 110 and a level adjuster with pattern dependency 120B. In these embodiments, an input of the Viterbi decoder 110 is an output of a finite impulse response equalizer (FIR EQ) such as that mentioned above, and therefore, is labeled as "FIR_EQ_OUT". In addition, an output of the Viterbi decoder 110 is labeled as "Viterbi_Out".

Referring to FIG. 1A, the level adjuster with pattern dependency 120A is arranged to generate a plurality of Viterbi target levels with pattern dependency according to the input FIR_EQ_OUT of the Viterbi decoder 110, and the Viterbi decoder 110 is arranged to perform Viterbi decoding according to the Viterbi target levels with pattern dependency. Please note that the slicer 130 is arranged to perform a slicing operation on the input FIR_EQ_OUT of the Viterbi decoder 110 to generate a sliced result, where the level adjuster with pattern dependency 120A generates the Viterbi target levels with pattern dependency according to the sliced result and the input FIR_EQ_OUT.

Referring to FIG. 1B, the level adjuster with pattern dependency 120B is arranged to generate a plurality of Viterbi target levels with pattern dependency according to the output Viterbi_Out of the Viterbi decoder 110, and the Viterbi decoder 110 is arranged to perform Viterbi decoding according to the Viterbi target levels with pattern dependency.

No matter whether the architecture shown in FIG. 1A or FIG. 1B is utilized, as the Viterbi target levels with pattern dependency sometimes vary in response to pattern dependency of a reproduced signal on a read path comprising the Viterbi decoder 110, the Viterbi decoding control provided by the architecture shown in FIG. 1A or FIG. 1B can be optimized in response to the pattern dependency. More specifically, the pattern dependency represents the dependency of one or more lands such as mL, the dependency of one or more pits such as nP, and/or the dependency of one or more of various combinations of one or more pits and one or more lands, such as combinations (mL, nP), (mP, nL), (mL, nP, qL), (mP, nL, qP), (mL, nP, qL, rP), (mP, nL, qP, rL), and so on. Here, the notations L and P respectively represent a land and a pit, and the notations m, n, q, r, . . . , etc. respectively represent the number of T of a pit or the number of T of a land, for denoting the ideal lengths of the pit or the land, where T represents a period of a clock signal such as an EFM clock or the like. For example, in a situation where m=2 and n=2, the combination (mL, nP) represents the combination of a 2T-land and a 2T-pit. In another example, in a situation where m=3, n=2, q=4, and r=5, the combination (mP, nL, qP, rL) represents the combination of a 3T-pit, a 2T-land, a 4T-pit and a 5T-land. By utilizing the architecture shown in FIG. 1A or FIG. 1B, the Viterbi target levels with pattern dependency are properly extracted in response to the pattern dependency. Therefore, the present invention can provide better Viterbi decoding control than that of the related art.

Figure 2:
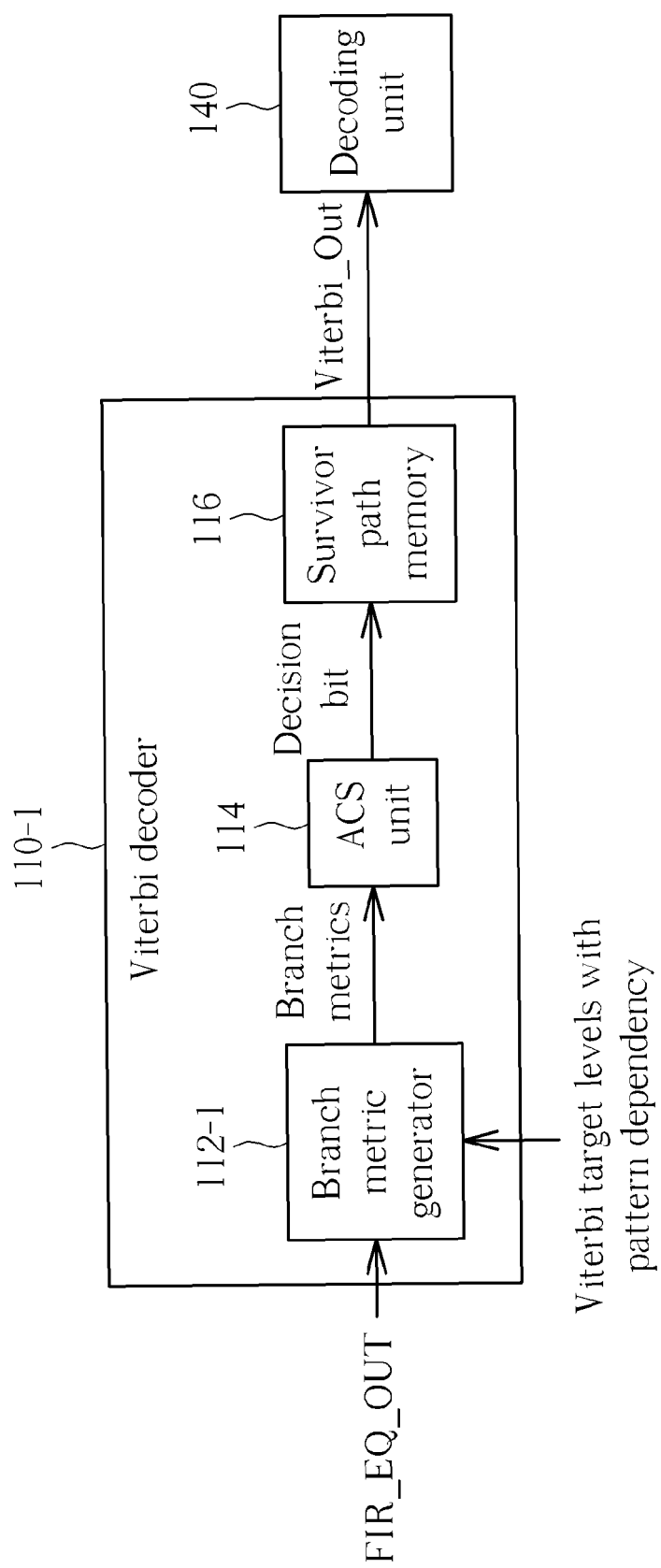
FIG. 2 illustrates implementation details of the Viterbi decoder shown in FIG. 1A or FIG. 1B according to an embodiment of the present invention.

FIG. 2 illustrates implementation details of the Viterbi decoder 110 shown in FIG. 1A or FIG. 1B according to an embodiment of the present invention. Here, the notation 110-1 is utilized for representing the Viterbi decoder 110 shown in FIG. 1A or FIG. 1B in this embodiment. The Viterbi decoder 110-1 comprises: a branch metric generator 112-1, an add-compare-select (ACS) unit 114, and a survivor path memory 116. The branch metric generator 112-1 is arranged to generate a plurality of branch metrics (and more particularly, a plurality of branch metrics with pattern dependency) according to the input FIR_EQ_OUT of the Viterbi decoder 110-1 and the Viterbi target levels with pattern dependency mentioned above. In addition, the ACS unit 114 is arranged to perform ACS operations according to the branch metrics to generate a plurality of decision bits, and the survivor path memory 116 is arranged to temporarily store the decision bits and output the output Viterbi_Out of the Viterbi decoder 110-1. Additionally, no matter whether the architecture shown in FIG. 1A or FIG. 1B is utilized, the aforementioned decoding circuit (e.g. the decoding circuit 100A or the decoding circuit 100B) may further comprises a decoding unit 140 arranged to decode the output Viterbi_Out of the Viterbi decoder 110 to generate at least one decoded result.

Figure 3A:
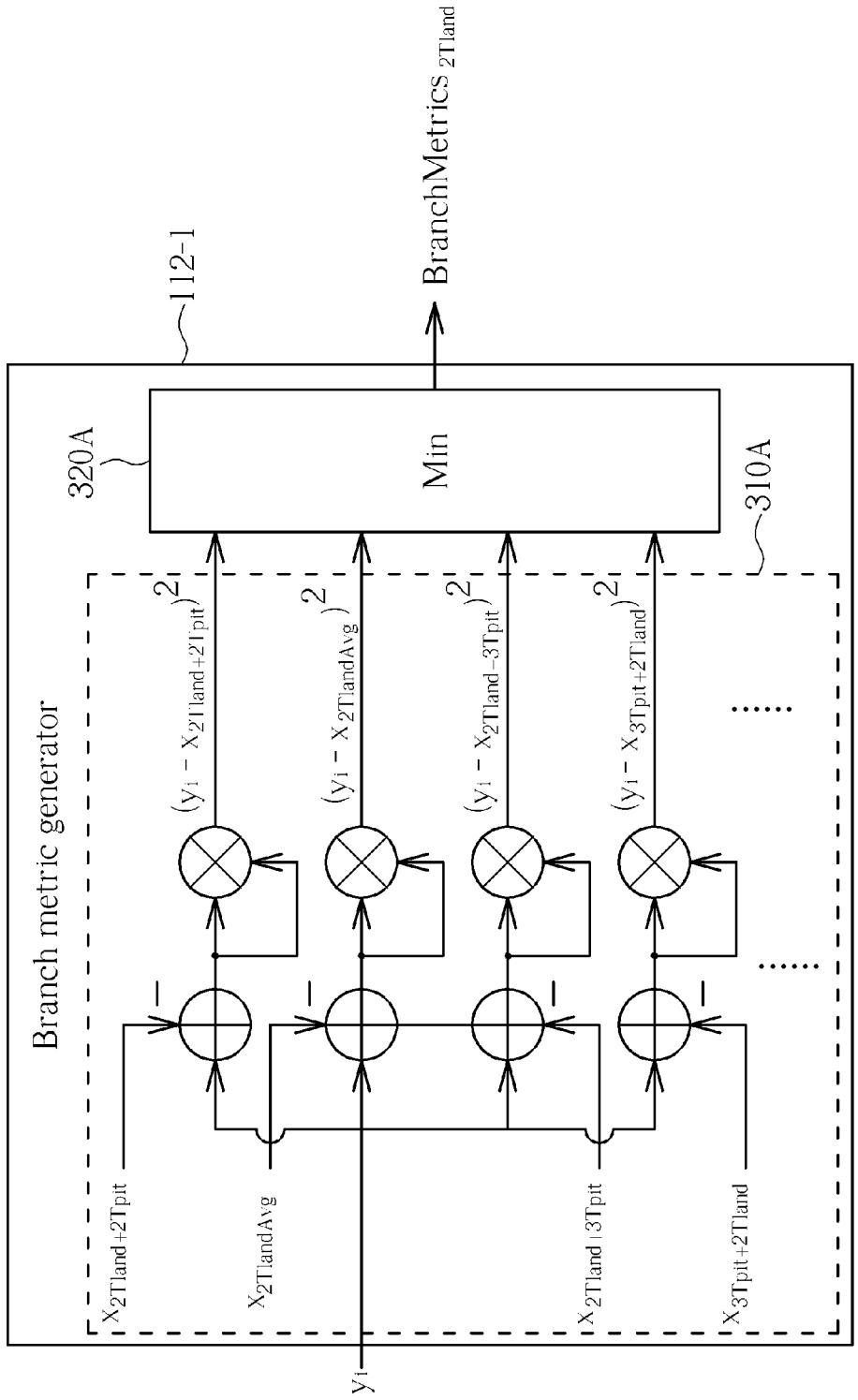
FIG. 3A illustrates the branch metric generator shown in FIG. 2 according to an embodiment of the present invention.

FIG. 3A illustrates the branch metric generator 112-1 shown in FIG. 2 according to an embodiment of the present invention. The branch metric generator 112-1 comprises a plurality of branch metric generation paths 310A and a selection unit 320A. The branch metric generation paths 310A are arranged to generate a plurality of intermediate values (e.g. those labeled on the outputs of the branch metric generation paths 310A, such as $(y_i - x_{2Tland+2Tpit})^2$, $(y_i - x_{2TlandAvg})^2$, $(y_i - x_{2Tland+3Tpit})^2$, $(y_i - x_{3Tpit+2Tland})^2$, etc.) according to the input FIR_EQ_OUT of the Viterbi decoder 110 and the Viterbi target levels with pattern dependency, respectively. In addition, the selection unit 320A (which is labeled "Min" in FIG. 3A) is arranged to select a portion of the intermediate values as the branch metrics with pattern dependency. The notation BranchMetrics$_{2Tland}$ represents the branch metrics with the suffix thereof denoting the branch metrics with pattern dependency, where the branch metrics corresponding to 2T-land are taken as an example of the branch metrics with pattern dependency.

Here, the notation $y_i$ represents the input FIR_EQ_OUT with the suffix i thereof denoting the respective values carried by the input FIR_EQ_OUT. In addition, the notation x (e.g. $x_{2Tland+2Tpit}$, $x_{2TlandAvg}$, $x_{2Tland+3Tpit}$, $x_{3Tpit+2Tland}$, etc.) represents the Viterbi target levels with the suffix thereof denoting the Viterbi target levels with pattern dependency. For example, the notation $x_{2Tland+2Tpit}$ represents the Viterbi target level corresponding to the combination (2L, 2P), the notation $x_{2Tland+3Tpit}$ represents the Viterbi target level corresponding to the combination (2L, 3P), and the notation $x_{3Tpit+2Tland}$ represents the Viterbi target level corresponding to the combination (3P, 2L). In another example, the notation $x_{2TlandAvg}$ represents an average of the Viterbi target levels corresponding to the combinations having at least one 2T-land.

Please note that, in this embodiment, each of the branch metric generation paths 310A comprises an arithmetic unit (e.g. an adder having an inverted input) arranged to calculate a difference between the input of the Viterbi decoder and one of the Viterbi target levels with pattern dependency, and further comprises a square unit (e.g. a multiplier) arranged to calculate a square value of the difference to generate one of the intermediate values, where the selection unit 320A selects a minimum of the intermediate values, and is therefore labeled "Min". This is for illustrative purposes only, and is not meant to be a limitation of the present invention. According to a variation of the embodiment shown in FIG. 3A, such as that shown in FIG. 3B, at least a portion of the aforementioned branch metric generation paths, such as the branch metric generation path 310B of the branch metric generator 112-2 of this variation, comprises an arithmetic unit (e.g. an adder having an inverted input) arranged to calculate a difference between the input of the Viterbi decoder and a Viterbi target level, and further comprises a square unit (e.g. a multiplier) arranged to calculate a square value of the difference to generate an intermediate value, where the selection unit 320B selects a constant value or the intermediate value as at least a portion of the branch metrics with pattern dependency according to a control signal.

In this variation, the selection unit 320B is a multiplexer, and is therefore labeled "MUX", where the notation $C_{2Tland}$ corresponding to 2T-land is taken as an example of the constant value of this variation. For example, the constant value can be zero. In a situation where the branch metric generator 112-1 shown in FIG. 2 is replaced by the branch metric generator 112-2 of this variation, under control of the control signal such as that shown in FIG. 3B, the selection unit 320B can select the constant value or the intermediate value. Please note that the control signal may be a control signal with pattern dependency or a control signal without pattern dependency. In the case of the control signal with pattern dependency, when it is detected that levels corresponding to a specific pattern (e.g. levels corresponding to 2T-land) are severely scattered, the selection unit 320B can select the constant value. In the case of the control signal without pattern dependency, when it is detected that the decoded result is not good enough, the selection unit 320B can select the constant value. Similar descriptions are not repeated for this variation. Embodiments of the control signal will be described later referring to FIGS. 4-5.

Figure 3B:
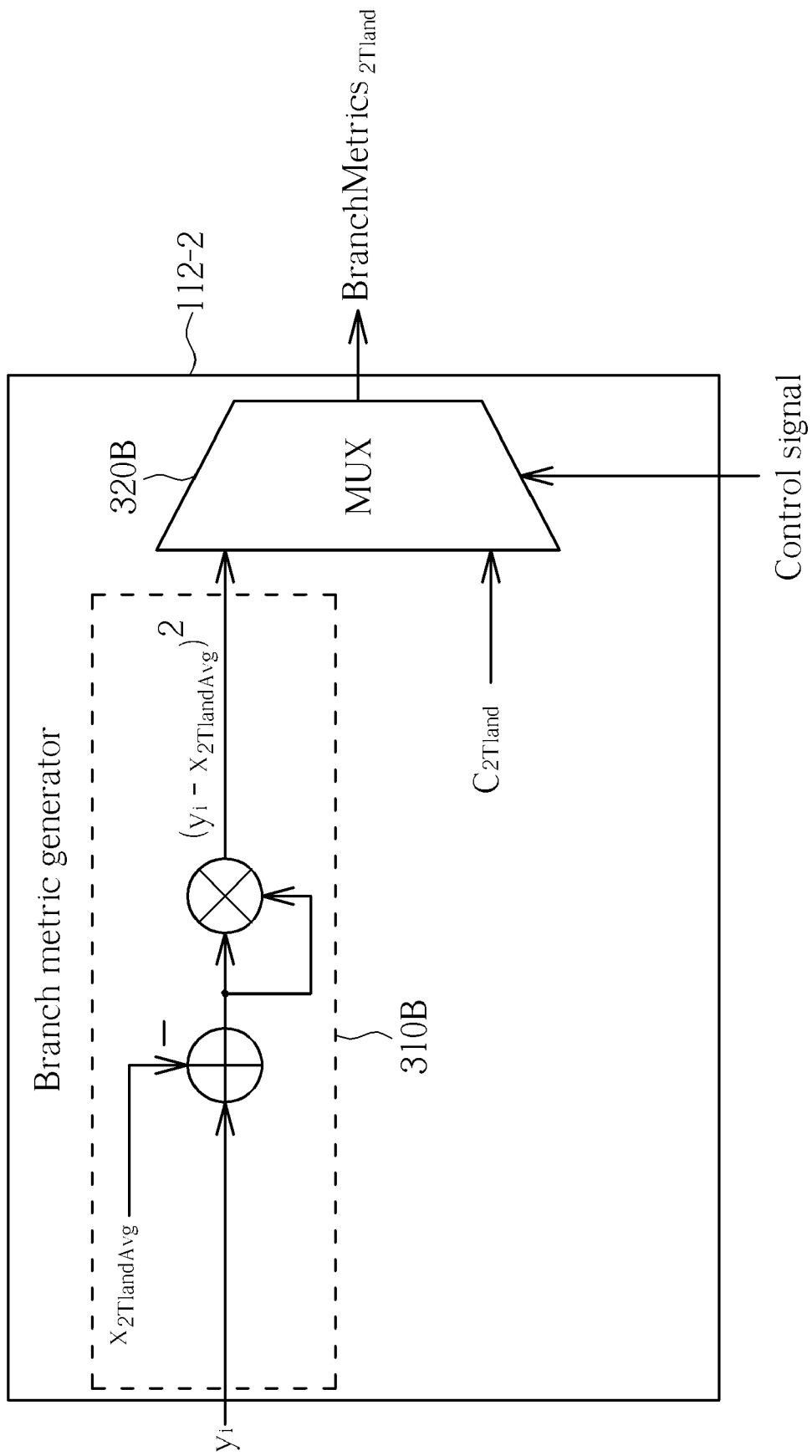
FIG. 3B illustrates the branch metric generator shown in FIG. 2 according to a variation of the embodiment shown in FIG. 3A.

According to a variation of the embodiment shown in FIG. 3B, the branch metric generation path 310B is not involved with pattern dependency, while the control signal may be a control signal with pattern dependency or a control signal without pattern dependency. In the case of the control signal with pattern dependency, when it is detected that levels corresponding to a specific pattern (e.g. levels corresponding to 2T-land) are severely scattered, the selection unit 320B can select the constant value. In the case of the control signal without pattern dependency, when it is detected that the decoded result is not good enough, the selection unit 320B can select the constant value. Similar descriptions are not repeated for this variation. Embodiments of the control signal will be described later referring to FIGS. 4-5.

Figure 3C:
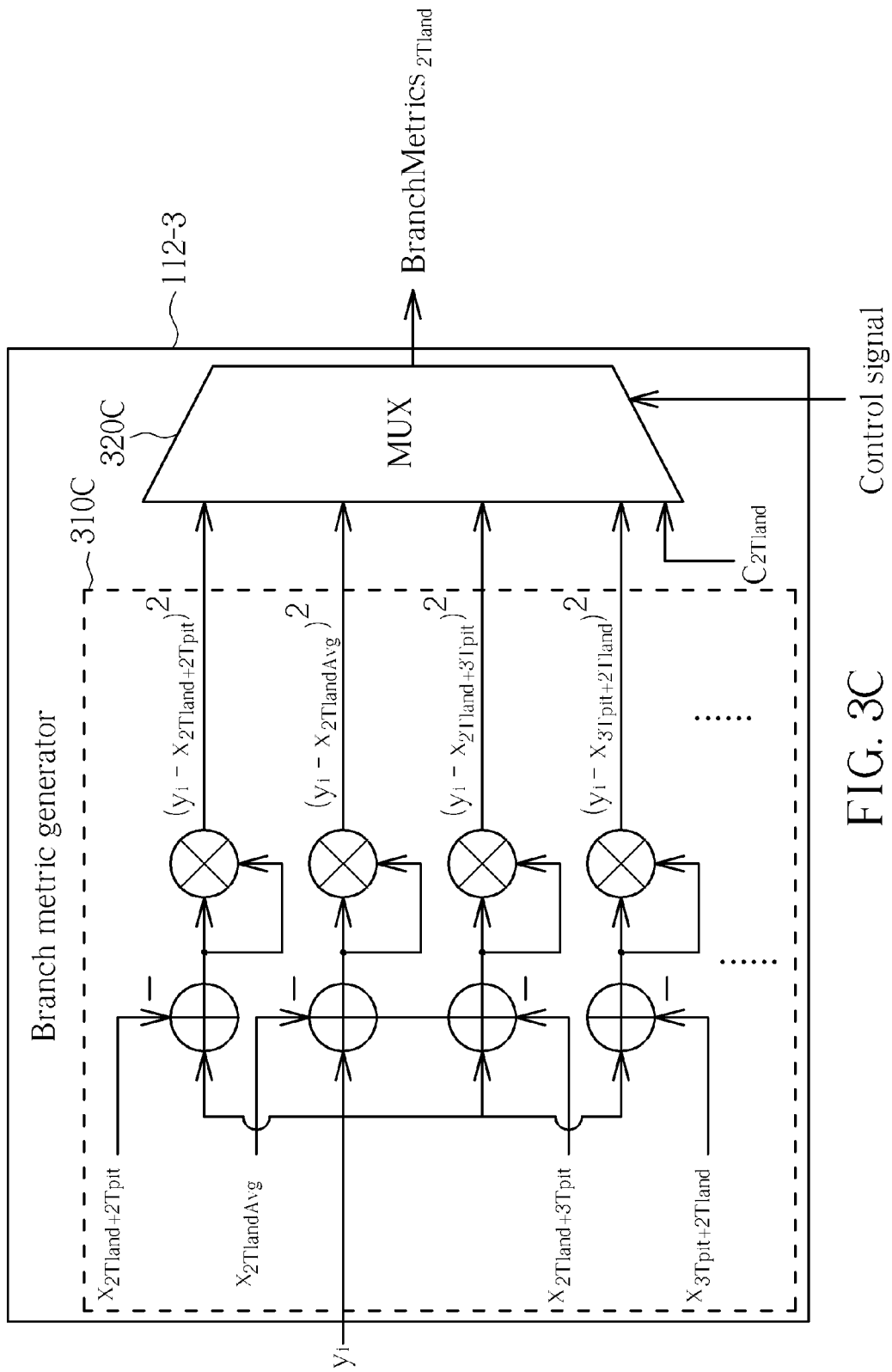
FIG. 3C illustrates the branch metric generator shown in FIG. 2 according to another variation of the embodiment shown in FIG. 3A.

According to a variation of the embodiment shown in FIG. 3A, such as that shown in FIG. 3C, at least a portion of the aforementioned branch metric generation paths (e.g. the branch metric generation paths 310C of the branch metric generator 112-3) comprises an arithmetic unit (e.g. an adder having an inverted input) arranged to calculate a difference between the input of the Viterbi decoder and one of the Viterbi target levels with pattern dependency, and further comprises a square unit (e.g. a multiplier) arranged to calculate a square value of the difference to generate one of the intermediate values, where the selection unit 320C selects a constant value or one of a minimum of the intermediate values according to a control signal.

In this variation, the selection unit 320C is a multiplexer, and is therefore labeled "MUX", where the notation $C_{2Tland}$ corresponding to 2T-land is taken as an example of the constant value of this variation. For example, the constant value can be zero. In a situation where the branch metric generator 112-1 shown in FIG. 2 is replaced by the branch metric generator 112-3 of this variation, under control of the control signal such as that shown in FIG. 3C, the selection unit 320C can select the constant value or one of the minimum of the intermediate values. Similar descriptions are not repeated for this variation. Embodiments of the control signal will be described later referring to FIGS. 4-5.

Please note that the branch metric generator arranged to generate the branch metrics corresponding to 2T-land is taken as an example in some embodiments disclosed above (e.g. those arranged to generate the branch metrics $BranchMetrics_{2Tland}$ shown in FIGS. 3A-3C). This is for illustrative purposes only, and is not meant to be a limitation of the present invention. According to some other embodiments of the present invention (e.g. variations of those shown in FIGS. 3A-3C), generating the branch metrics respectively corresponding to specific patterns, such as the branch metrics respectively corresponding to lands of various numbers of T, pits of various numbers of T, and various combinations of pits and lands (e.g. the branch metrics $BranchMetrics_{mTland}$, $BranchMetrics_{nTpit}$, $BranchMetrics_{(mL, np)}$, $BranchMetrics_{(mP, nL)}$, $BranchMetrics_{(mL, nP, qL)}$, $BranchMetrics_{(mP, nL, qP)}$, . . . , etc.), can be implemented by similar methods and the corresponding branch metric generators.

Figure 4:
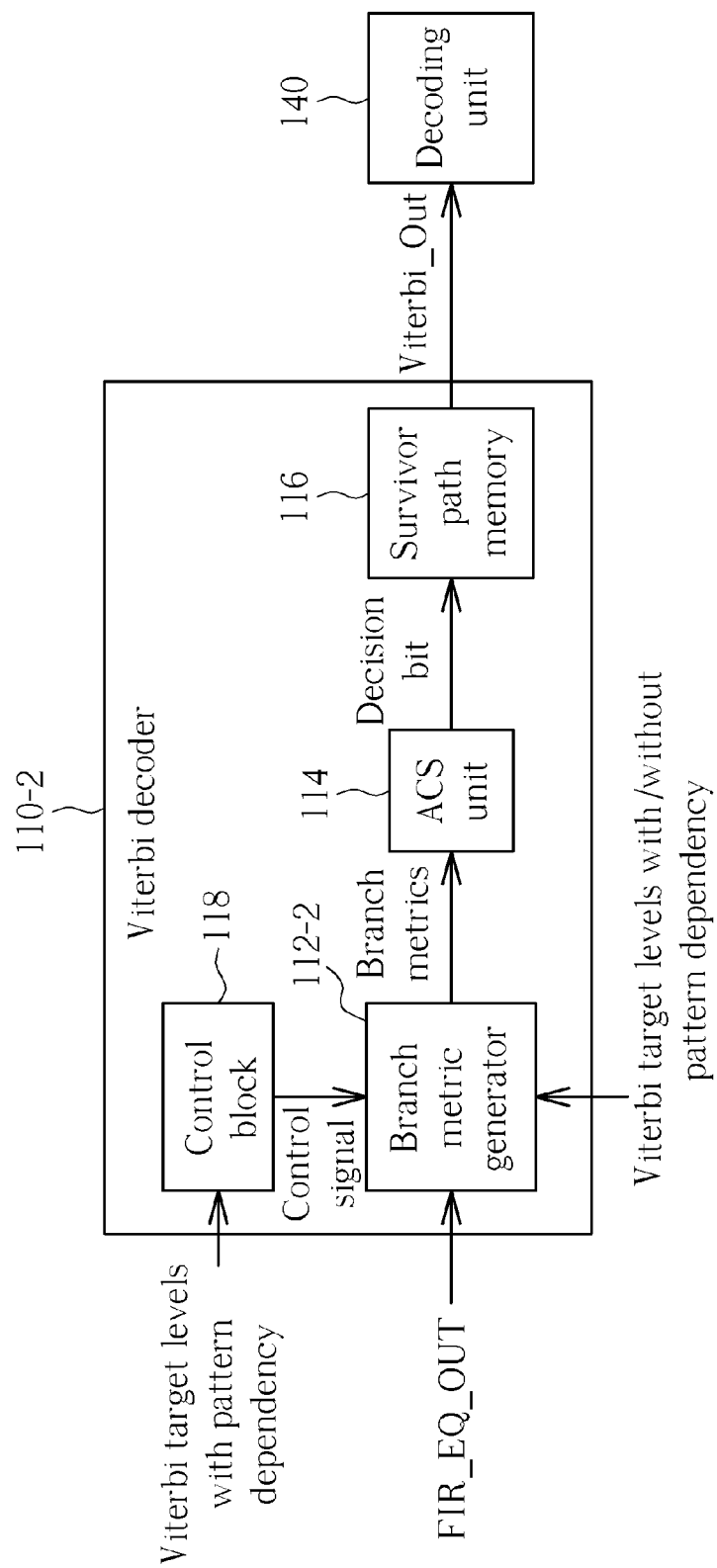
FIGS. 4-6 illustrate implementation details of the Viterbi decoder shown in FIG. 1A or FIG. 1B according to some embodiments of the present invention.
Figure 5:
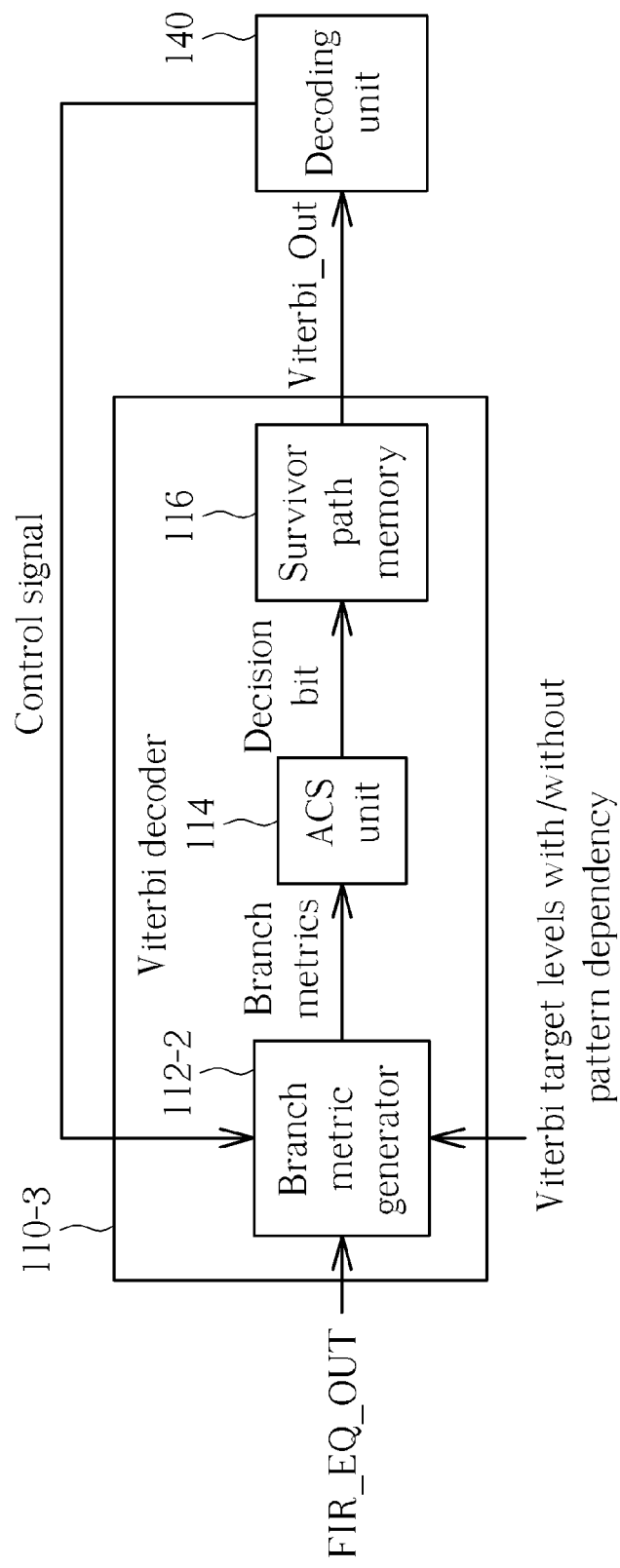
Figure 6:
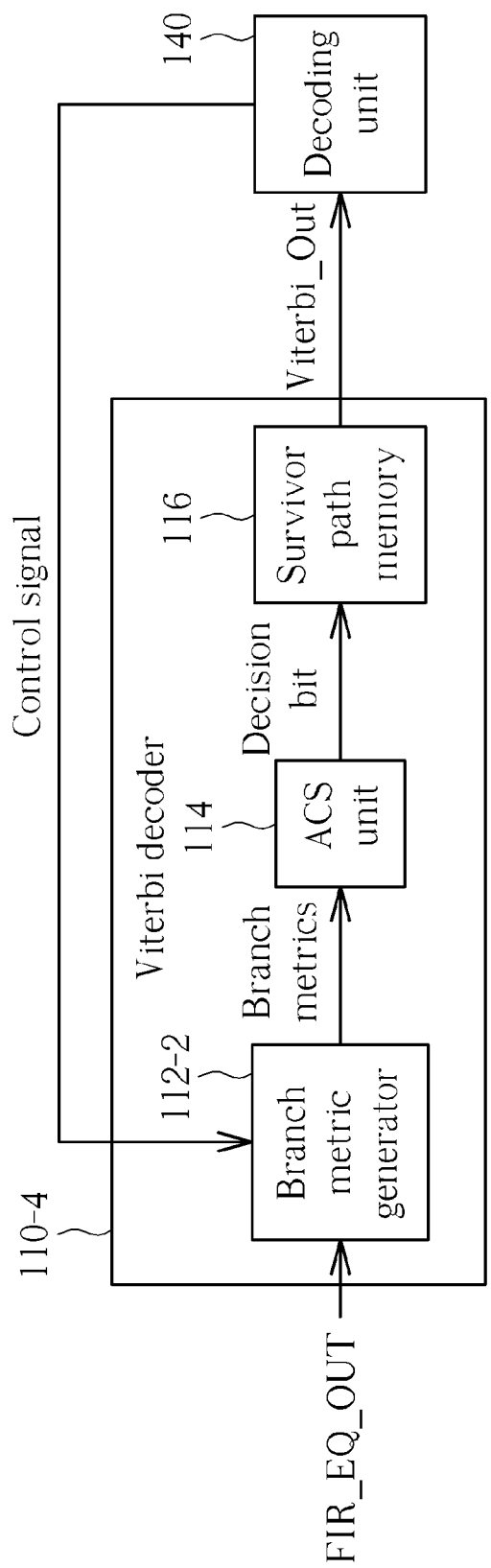

FIGS. 4-6 illustrate implementation details of the Viterbi decoder 110 shown in FIG. 1A or FIG. 1B according to some embodiments of the present invention, where these embodiments are variations of the embodiment shown in FIG. 2.

Referring to FIG. 4, the notation 110-2 is utilized for representing the Viterbi decoder 110 shown in FIG. 1A or FIG. 1B in this embodiment. In addition to the ACS unit 114 and the survivor path memory 116 mentioned above, the Viterbi decoder 110-2 further comprises the branch metric generator 112-2 shown in FIG. 3B and a control block 118. The branch metric generator 112-2 could be replaced by the branch metric generator 112-3 shown in FIG. 3C. The control block 118 is arranged to generate a control signal, such as that shown in FIG. 3B or FIG. 3C, according to the Viterbi target levels with pattern dependency. In addition, the branch metric generator 112-2 is arranged to generate a plurality of branch metrics according to the input FIR_EQ_OUT of the Viterbi decoder 110, the control signal, and a plurality of Viterbi target levels. In the case of the branch metric generator 112-3, it is arranged to generate a plurality of branch metrics according to the input FIR_EQ_OUT of the Viterbi decoder 110, the control signal, and a plurality of Viterbi target levels comprising the Viterbi target levels with pattern dependency.

For example, when it is detected that the Viterbi target levels with pattern dependency corresponding to 2T-land separate from other portions of the Viterbi target levels with pattern dependency, the control block 118 may control the selection unit 320B or 320C such as the multiplexer mentioned above to select the constant value such as $C_{2Tland}$, and more particularly, zero. Similarly, when it is detected that the Viterbi target levels with pattern dependency corresponding to mT-land separate from other portions of the Viterbi target levels with pattern dependency, the control block 118 may control the selection unit 320B or 320C to select the constant value such as $C_{mTland}$. In another example, when it is detected that the Viterbi target levels with pattern dependency corresponding to nT-pit separate from other portions of the Viterbi target levels with pattern dependency, the control block 118 may control the selection unit 320B or 320C to select the constant value $C_{nTpit}$.

In this embodiment, the operations of the ACS unit 114 and the survivor path memory 116 are similar to those disclosed above, and therefore, are not repeated in detail.

Referring to FIG. 5, the notation 110-3 is utilized for representing the Viterbi decoder 110 shown in FIG. 1A or FIG. 1B in this embodiment. This embodiment is a variation of the embodiment shown in FIG. 4. The Viterbi decoder 110-3 is arranged to perform Viterbi decoding according to the control signal received from the decoding unit 140. The branch metric generator 112-2 could be replaced by the branch metric generator 112-3 shown in FIG. 3C. More particularly, the branch metric generator 112-2 or 112-3 is arranged to generate a plurality of branch metrics according to the input FIR_EQ_OUT of the Viterbi decoder 110 and the control signal, where the decoding unit 140 is arranged to decode the output Viterbi_Out of the Viterbi decoder 110 to generate the control signal, based upon at least one decoded result of the decoding unit 140. In addition, the branch metric generator 112-2 generates the branch metrics according to a plurality of Viterbi target levels. In the case of the branch metric generator 112-3, it is arranged to generate a plurality of branch metrics according to a plurality of Viterbi target levels comprising the Viterbi target levels with pattern dependency. The operations of the ACS unit 114 and the survivor path memory 116 are similar to those disclosed above, and therefore, are not repeated in detail.

Referring to FIG. 6, the notation 110-4 is utilized for representing the Viterbi decoder 110 shown in FIG. 1A or FIG. 1B in this embodiment. This embodiment is a variation of the embodiment shown in FIG. 4, and is a variation of the embodiment shown in FIG. 5. Please note that the branch metric generator 112-2 generates the branch metrics according to the input FIR_EQ_OUT of the Viterbi decoder 110 and the control signal, where the decoding unit 140 is arranged to decode the output Viterbi_Out of the Viterbi decoder 110 to generate at least one decoded result, and the control signal corresponds to the decoded result. The operations of the ACS unit 114 and the survivor path memory 116 are similar to those disclosed above, and therefore, are not repeated in detail.

Please note that, according to variations of some embodiments disclosed above (e.g. variations of those shown in FIGS. 4-6), the branch metric generation path(s) mentioned above can be not involved with pattern dependency, while the control signal (if exists) may be a control signal with pattern dependency or a control signal without pattern dependency. In the case of the control signal with pattern dependency, when it is detected that levels corresponding to a specific pattern are severely scattered, the selection unit mentioned above can select the constant value (if exists). In the case of the control signal without pattern dependency, when it is detected that the decoded result is not good enough, the selection unit mentioned above can select the constant value (if exists). Similar descriptions are not repeated for these variations.

In addition, according to variations of some embodiments disclosed above (e.g. variations of those shown in FIGS. 3A-3C and FIGS. 2, 4, 5 and 6), the square unit(s) in the branch metric generation path(s) mentioned above can be replaced with an absolute value calculation unit, where the absolute value calculation unit is arranged to calculate an absolute value of the difference to generate the associate intermediate value. In these variations, each branch metric generation path outputs an absolute value of the difference generated therein, instead of the square value of the difference. Any other variations indicating the magnitudes of the differences could apply to this invention. The magnitude of the difference is one of the parameters employed in selecting the intermediate values. Similar descriptions are not repeated for these variations.

It is an advantage of the present invention that, by utilizing the decoding circuit of some embodiments of the present invention, the Viterbi target levels with pattern dependency are properly extracted in response to the pattern dependency. Therefore, the present invention can provide better Viterbi decoding control than that of the related art.

It is another advantage of the present invention that, by utilizing the decoding circuit of some embodiments of the present invention, the branch metrics are properly generated in response to the pattern dependency and/or at least one decoded result of the decoding unit. Therefore, the present invention can provide better Viterbi decoding control than that of the related art.

Those skilled in the art will readily observe that numerous modifications and alterations of the device and method may be made while retaining the teachings of the invention.

What is claimed is:

1. A decoding circuit, comprising:
   a level adjuster with pattern dependency arranged to generate a plurality of Viterbi target levels with pattern dependency; and
   a Viterbi decoder arranged to perform Viterbi decoding according to the Viterbi target levels with pattern dependency.

2. The decoding circuit of claim 1, wherein the level adjuster with pattern dependency generates the Viterbi target levels with pattern dependency according to an input of the Viterbi decoder.

3. The decoding circuit of claim 2, further comprising:
   a slicer arranged to perform a slicing operation on the input of the Viterbi decoder to generate a sliced result;
   wherein the level adjuster with pattern dependency generates the Viterbi target levels with pattern dependency according to the sliced result.

4. The decoding circuit of claim 1, wherein the level adjuster with pattern dependency generates the Viterbi target levels with pattern dependency according to an output of the Viterbi decoder.

5. The decoding circuit of claim 1, wherein the Viterbi decoder comprises:
   a branch metric generator arranged to generate a plurality of branch metrics according to an input of the Viterbi decoder and the Viterbi target levels with pattern dependency;
   an add-compare-select (ACS) unit arranged to perform ACS operations according to the branch metrics to generate a plurality of decision bits; and
   a survivor path memory arranged to temporarily store the decision bits and output an output of the Viterbi decoder.

6. The decoding circuit of claim 1, wherein the Viterbi decoder comprises:
   a control block arranged to generate a control signal according to the Viterbi target levels with pattern dependency;
   a branch metric generator arranged to generate a plurality of branch metrics according to an input of the Viterbi decoder, the control signal, and a plurality of Viterbi target levels;
   an add-compare-select (ACS) unit arranged to perform ACS operations according to the branch metrics to generate a plurality of decision bits; and
   a survivor path memory arranged to temporarily store the decision bits and output an output of the Viterbi decoder.

7. The decoding circuit of claim 6, wherein the plurality of Viterbi target levels comprises the Viterbi target levels with pattern dependency.

8. A decoding circuit, comprising:
   a Viterbi decoder arranged to perform Viterbi decoding according to a plurality of Viterbi target levels with pattern dependency, wherein the Viterbi decoder comprises a branch metric generator arranged to generate a plurality of branch metrics with pattern dependency according to an input of the Viterbi decoder and the Viterbi target levels with pattern dependency, and the branch metric generator comprises:
      a plurality of branch metric generation paths arranged to generate a plurality of intermediate values according to the input of the Viterbi decoder and the Viterbi target levels with pattern dependency, respectively; and
      a selection unit arranged to select a portion of the intermediate values as the branch metrics with pattern dependency.

9. The decoding circuit of claim 8, wherein each of the branch metric generation paths comprises:
   an arithmetic unit arranged to calculate a difference between the input of the Viterbi decoder and one of the Viterbi target levels with pattern dependency.

10. The decoding circuit of claim 9, wherein the selection unit selects a minimum of the intermediate values.

11. The decoding circuit of claim 9, wherein the selection unit selects a constant value or one of a minimum of the intermediate values.

12. The decoding circuit of claim 8, wherein the Viterbi decoder further comprises:
   an add-compare-select (ACS) unit arranged to perform ACS operations according to the branch metrics to generate a plurality of decision bits; and
   a survivor path memory arranged to temporarily store the decision bits and output an output of the Viterbi decoder.

13. The decoding circuit of claim 8, further comprising:
   a decoding unit arranged to decode an output of the Viterbi decoder to generate at least one decoded result.

14. A decoding circuit, comprising:
   a Viterbi decoder arranged to perform Viterbi decoding according to a Viterbi target level, wherein the Viterbi decoder comprises a branch metric generator arranged to generate at least a portion of a plurality of branch metrics with pattern dependency according to an input of the Viterbi decoder and the Viterbi target level, and the branch metric generator comprises:
      a branch metric generation path arranged to generate an intermediate value according to the input of the Viterbi decoder and the Viterbi target level; and
      a selection unit arranged to select the intermediate value or a constant value as at least the portion of the branch metrics with pattern dependency according to a control signal with pattern dependency.

15. The decoding circuit of claim 14, wherein the branch metric generation path comprises:
   an arithmetic unit arranged to calculate a difference between the input of the Viterbi decoder and the Viterbi target level.

16. The decoding circuit of claim 14, wherein the Viterbi decoder further comprises:
   an add-compare-select (ACS) unit arranged to perform ACS operations according to the branch metrics to generate a plurality of decision bits; and
   a survivor path memory arranged to temporarily store the decision bits and output an output of the Viterbi decoder.

17. The decoding circuit of claim 14, further comprising:
   a decoding unit arranged to decode an output of the Viterbi decoder to generate at least one decoded result.

18. A decoding circuit, comprising:
   a Viterbi decoder arranged to perform Viterbi decoding according to a control signal, wherein the Viterbi decoder comprises:
      a branch metric generator arranged to generate a plurality of branch metrics according to an input of the Viterbi decoder and the control signal;
      an add-compare-select (ACS) unit arranged to perform ACS operations according to the branch metrics to generate a plurality of decision bits; and
      a survivor path memory arranged to temporarily store the decision bits and output an output of the Viterbi decoder.

19. The decoding circuit of claim 18, wherein the Viterbi decoder further comprises:
   a control block arranged to generate the control signal according to a plurality of Viterbi target levels with pattern dependency.

20. The decoding circuit of claim 19, wherein the branch metric generator generates the branch metrics according to a plurality of Viterbi target levels comprising the Viterbi target levels with pattern dependency.

21. The decoding circuit of claim 18, further comprising:
   a decoding unit arranged to decode the output of the Viterbi decoder to generate the control signal.

22. The decoding circuit of claim 21, wherein the branch metric generator generates the branch metrics according to a plurality of Viterbi target levels.

23. The decoding circuit of claim 18, further comprising:
   a decoding unit arranged to decode the output of the Viterbi decoder to generate at least one decoded result, wherein the control signal corresponds to the decoded result.

* * * * *